(12) United States Patent
Zheng et al.

(10) Patent No.: US 10,957,230 B2
(45) Date of Patent: Mar. 23, 2021

(54) SHIFT REGISTER UNIT AND DRIVING METHOD FOR THE SAME, GATE DRIVING CIRCUIT AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Liangliang Zheng, Beijing (CN); Tingting Jin, Beijing (CN); Tao Yu, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 148 days.

(21) Appl. No.: 16/156,010

(22) Filed: Oct. 10, 2018

(65) Prior Publication Data

US 2019/0287447 A1    Sep. 19, 2019

(30) Foreign Application Priority Data

Mar. 14, 2018    (CN) .......................... 201810210968.5

(51) Int. Cl.
*G11C 19/00*    (2006.01)
*G09G 3/20*    (2006.01)
(Continued)

(52) U.S. Cl.
CPC ............. *G09G 3/20* (2013.01); *G09G 3/3677* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS

2003/0222311 A1* 12/2003 Kim ..................... G02F 1/13454
257/347
2011/0193831 A1* 8/2011 Kunimori ............ G11C 19/184
345/204
(Continued)

FOREIGN PATENT DOCUMENTS

CN    101826309 A    9/2010
CN    103440839 A    12/2013
(Continued)

OTHER PUBLICATIONS

First Office Action for Chinese Application No. 201810210968.5, dated Mar. 16, 2020, 11 Pages.

*Primary Examiner* — Tuan T Lam
(74) *Attorney, Agent, or Firm* — Brooks Kushman P.C.

(57) ABSTRACT

A shift register unit provided according to embodiments of the present disclosure includes an input circuit, a pull-up circuit, a control circuit, and a first discharge circuit. The pull-up circuit is configured to control an output of the signal output terminal. The control circuit is configured to control a potential of the second node based on a second voltage signal of the second voltage terminal and a potential of the first node. The first discharge circuit is configured to control, after being turned on under the control of the potential of the second node, the first node and the signal output terminal by using the third voltage terminal, and discharging a pixel unit, the first node and the signal output terminal, the pixel unit being connected to the signal output terminal.

17 Claims, 6 Drawing Sheets

(51) Int. Cl.
*G11C 19/28* (2006.01)
*G09G 3/36* (2006.01)
(52) U.S. Cl.
CPC ............ *G09G 2310/0286* (2013.01); *G09G 2310/061* (2013.01); *G09G 2310/08* (2013.01); *G09G 2320/0247* (2013.01); *G09G 2320/0257* (2013.01); *G09G 2330/021* (2013.01); *G09G 2330/027* (2013.01)

(56) References Cited

U.S. PATENT DOCUMENTS

| | | | | |
|---|---|---|---|---|
| 2011/0228893 | A1* | 9/2011 | Tobita | G11C 19/184 377/77 |
| 2011/0274236 | A1* | 11/2011 | Tobita | G11C 19/28 377/79 |
| 2012/0269316 | A1* | 10/2012 | Jang | G09G 3/3677 377/75 |
| 2014/0168049 | A1* | 6/2014 | Gu | G09G 3/3685 345/100 |
| 2015/0294733 | A1 | 10/2015 | Tan et al. | |
| 2015/0317954 | A1* | 11/2015 | Jang | G09G 3/20 345/213 |
| 2017/0178558 | A1* | 6/2017 | Zhou | G09G 3/20 |
| 2017/0287428 | A1* | 10/2017 | Xue | G09G 3/3677 |
| 2018/0082652 | A1 | 3/2018 | Lv et al. | |
| 2018/0240431 | A1* | 8/2018 | Xu | G09G 3/3677 |
| 2018/0286302 | A1* | 10/2018 | Feng | G11C 19/184 |
| 2019/0096037 | A1* | 3/2019 | Fukazawa | G06T 7/70 |
| 2019/0096352 | A1 | 3/2019 | Xue et al. | |
| 2019/0355432 | A1* | 11/2019 | Su | G11C 19/28 |
| 2020/0005698 | A1* | 1/2020 | Dai | G11C 19/28 |

FOREIGN PATENT DOCUMENTS

| | | |
|---|---|---|
| CN | 105529009 A | 4/2016 |
| CN | 107591139 A | 1/2018 |

\* cited by examiner

| Potentials | t0~t1 | t1~t2 | t2~t3 | t3~ | t0'~t1' | t1'~t2' | t2'~t3' | t3'~t4' | t4'~ |
|---|---|---|---|---|---|---|---|---|---|
| CLKA | VGL | VGL | VGH | VGL/VGH | VGL | VGL | VGL | VGL | GND |
| CLKB | VGL | VGL | VGL | VGH/VGL | VGH | VGL | VGL | VGL | GND |
| STV | VGL | VGH | VGH/VGL | VGL/VGH | VGL | VGL | VGL | VGL | GND |
| GCH | VGH | VGH | VGH | VGH | VGH | VGH | VGH | VGL | GND |
| GCL | VGL | VGL | VGL | VGL | VGL | VGH | VGH | VGL | GND |
| HVGH | VGH | VGH | VGH | VGH | VGH | VGL | VGL | VGL | GND |
| PU | VGL | VGH | VGH | VGL/VGH | VGL | VGL | VGL | VGL | GND |
| PD | VGH | VGL | VGL | VGH/VGL | VGH | VGH | VGH | VGL | GND |
| CON | VGL | VGL | VGL | VGL | VGL | VGL | VGL | VGH | GND |
| PL | HVGL | HVGL | HVGL | HVGL | HVGL | VGH | HVGL | LVGL | GND |
| Gn | VGL | VGL | VGH | VGL | VGL | VGH | VGL | VGL | GND |

FIG. 6

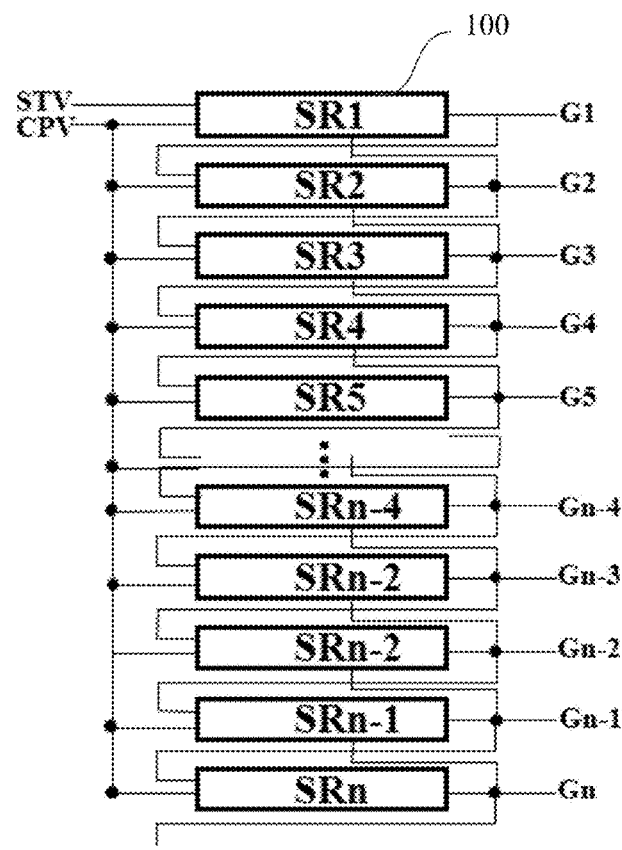

FIG. 7

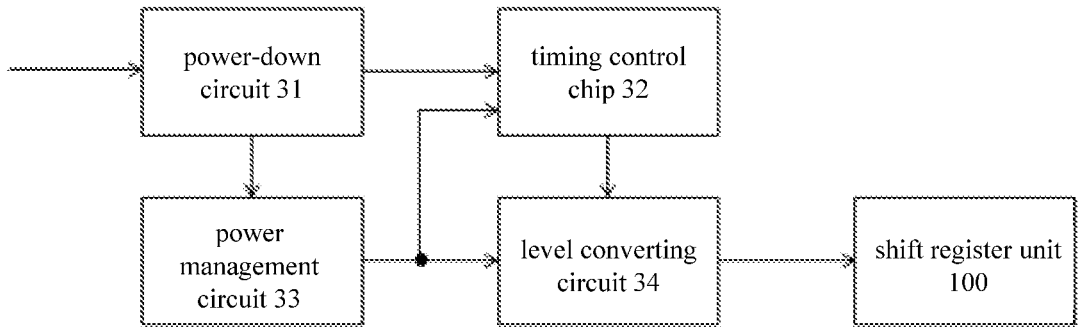

FIG. 8 during a shutdown process, a control circuit controls a potential of a second node under the control of a second voltage signal received by a second voltage terminal, so that a first discharge circuit is turned on under the control of the potential of the second node, and controls an output of a signal output terminal based on a first level provided by a third voltage terminal to turn on and discharge a corresponding pixel unit ⟋ S1 the first discharge circuit controls the first node and the signal output terminal to be discharged based on a second level provided by the third voltage terminal that is powered down to the ground at a first speed ⟋ S2

FIG. 9

SHIFT REGISTER UNIT AND DRIVING METHOD FOR THE SAME, GATE DRIVING CIRCUIT AND DISPLAY DEVICE

CROSS-REFERENCE TO RELATED APPLICATION

This application claims priority to Chinese Patent Application No. 201810210968.5 filed on Mar. 14, 2018, which is incorporated herein by reference in its entirety.

TECHNICAL FIELD

The present disclosure relates to the field of display technology, in particular to a shift register unit, a method for driving the shift register unit, a gate driving circuit and a display device.

BACKGROUND

A thin film transistor (TFT) liquid crystal display (LCD) is composed of a matrix of pixels arranged in both horizontal and vertical directions. Specifically, when the TFT liquid crystal display is displayed, a gate input signal is generated by a shift register, and each row of pixels is sequentially scanned from the first row to the last row. In the related art, the shift register is usually constituted by a plurality of stages of shift register units connected in series, and an output signal of the shift register unit at a preceding stage is used as an input signal of the shift register at a current stage. However, there is a problem that charge residual will occur inside the display device during a shutdown process, which will cause poor screen display such as image sticking after the shutdown due to charge residual inside the display device during the shutdown process, startup flickering and the like, and make it impossible to fit low-frequency driving of an oxide TFT display device.

SUMMARY

In a first aspect, an embodiment of the present disclosure provides a shift register unit that includes: an input circuit connected to a first voltage terminal, an input signal terminal, a reset signal terminal, a third voltage terminal and a first node, and configured to control a potential of the first node based on a first voltage signal received by the first voltage terminal, an input signal received by the input signal terminal and a reset signal received by the reset signal terminal; a pull-up circuit connected to the first node, a clock signal terminal and a signal output terminal of the shift register unit, and configured to control an output of the signal output terminal; a control circuit connected to a second voltage terminal, the first node and a second node, and configured to control a potential of the second node based on a second voltage signal received by the second voltage terminal and the potential of the first node; and a first discharge circuit connected to the second node, a third voltage terminal, the first node and the signal output terminal, and configured to control, after being turned on under the control of the potential of the second node, the first node and the signal output terminal by using the third voltage terminal, so as to discharge a pixel unit, the first node and the signal output terminal, the pixel unit being connected to the signal output terminal.

According to the shift register unit provided in the embodiment of the present disclosure, the control circuit controls the potential of the second node based on the second voltage signal received by the second voltage terminal and the potential of the first node, and the first discharge circuit controls, after being turned on under the control of the potential of the second node, the first node and the signal output terminal by using the third voltage terminal, so as to discharge the pixel unit, the first node and the signal output terminal, the pixel unit being connected to the signal output terminal.

In addition, the shift register unit according to the above embodiment of the present disclosure may further include the following additional technical features.

According to some embodiments of the present disclosure, the shift register unit further includes a second discharge circuit connected to a discharge control terminal, the third voltage terminal and the second node, and configured to discharge the second node by using the third voltage terminal under the control of a discharge control signal received by the discharge control terminal.

According to some embodiments of the present disclosure, the control circuit includes: a first transistor having a gate electrode and a first electrode which are both connected to the second voltage terminal, and a second electrode connected to the second node; and an eighth transistor having a gate electrode connected to the first node, a first electrode connected to the second node, and a second electrode connected to the third voltage terminal.

According to some embodiments of the present disclosure, the first discharge circuit is further connected to a fourth voltage terminal, and includes: a second transistor having a gate electrode connected to the second node, a first electrode connected to the signal output terminal, and a second electrode connected to the third voltage terminal; a third transistor having a gate electrode connected to the second node, a first electrode connected to the first node, and a second electrode connected to the third voltage terminal; and a fifth transistor having a gate electrode connected to a fourth voltage terminal, a first electrode connected to the signal output terminal, and a second electrode connected to the third voltage terminal.

According to some embodiments of the present disclosure, the second discharge circuit includes a fourth transistor having a gate electrode connected to the discharge control terminal, a first electrode connected to the second node, and a second electrode connected to the third voltage terminal.

According to some embodiments of the present disclosure, the pull-up circuit includes a ninth transistor having a gate electrode connected to the input circuit, a first electrode connected to the clock signal terminal, and a second electrode connected to the signal output terminal; and a first capacitor having one end connected to the first node and the other end connected to the signal output terminal.

According to some embodiments of the present disclosure, the input circuit includes a sixth transistor having a gate electrode connected to the input signal terminal, a first electrode connected to the first voltage terminal, and a second electrode connected to the first node; and a seventh transistor having a gate electrode connected to the reset signal terminal, a first electrode connected to the first node, and a second electrode connected to the third voltage terminal.

According to some embodiments of the present disclosure, the first to the ninth transistors are all thin film transistors.

According to some embodiments of the present disclosure, the first to the ninth transistors are all N-type thin film transistors.

According to some embodiments of the present disclosure, the first discharge circuit being configured to control, after being turned on under the control of the potential of the second node, the first node and the signal output terminal by using the third voltage terminal, so as to discharge the pixel unit, the first node and the signal output terminal, the pixel unit being connected to the signal output terminal includes: the first discharge circuit being configured to control, after being turned on under the control of the potential of the second node, the first node and the signal output terminal by using the third voltage terminal, so as to turn on and discharge the pixel unit connected to the signal output terminal, and then control the first node and the signal output terminal to be discharged based on a second level provided by the third voltage terminal that is powered down to the ground at a first speed.

According to some embodiments of the present disclosure, the second discharge circuit being configured to discharge the second node by using the third voltage terminal under the control of the discharge control signal received by the discharge control terminal includes: the second discharge circuit being configured to discharge the second node based on a second level provided by the third voltage terminal that is powered down to the ground at a second speed, under the control of the discharge control signal received by the discharge control terminal, wherein the second speed is substantially less than the first speed.

According to some embodiments of the present disclosure, a turn-on voltage drop of the third transistor is much greater than a turn-on voltage drop of the sixth transistor.

According to some embodiments of the present disclosure, a turn-on voltage drop of the eighth transistor is much less than a turn-on voltage drop of the first transistor.

In a second aspect, an embodiment of the present disclosure provides a gate driving circuit that includes a plurality of stages of the shift register units as described above. Except for the shift register unit at a first stage, the input signal terminal of the shift register unit at each of the remaining stages is connected to the signal output terminal of the shift register unit at an immediately preceding stage, and except for the shift register unit at the last stage, the signal output terminal of the shift register unit at each of the remaining stages is connected to the reset signal terminal of the shift register unit at an immediately preceding stage.

In a third aspect, an embodiment of the present disclosure provides a display device that includes any of the gate driving circuits as described above.

According to some embodiments of the present disclosure, the display device further includes a power-down circuit, a timing control chip and a power management circuit. The power-down circuit is connected to each of the timing control chip and the power management circuit. The power-down circuit is configured to detect a voltage of a power supply of the display device and send a shutdown signal to the timing control chip and the power management circuit when the voltage of the power supply is lower than a preset voltage threshold. The timing control chip and the power management circuit control the shift register unit to enter a shutdown process according to the shutdown signal.

According to some embodiments of the present disclosure, the display device is an oxide TFT display device.

In a fourth aspect, an embodiment of the present disclosure provides a method for driving a shift register unit, which includes the following steps: during a shutdown process, controlling, by the control circuit, a potential of the second node under the control of a second voltage signal received by the second voltage terminal, so that the first discharge circuit is turned on under the control of the potential of the second node, and controls an output of the signal output terminal according to a first level provided by the third voltage terminal, so as to turn on and discharge a corresponding pixel unit; and controlling, by the first discharge circuit, the first node and the signal output terminal to be discharged based on a second level provided by the third voltage terminal that is powered down to the ground at a first speed.

According to the method for driving the shift register unit provided in the embodiment of the present disclosure, during the shutdown process, the control circuit controls the potential of the second node under the control of the second voltage signal received by the second voltage terminal, so that the first discharge circuit is turned on under the control of the potential of the second node, and controls the output of the signal output terminal according to the first level provided by the third voltage terminal, so as to turn on and discharge the corresponding pixel unit. Moreover, the first discharge circuit controls the first node and the signal output terminal to be discharged based on the second level provided by the third voltage terminal that is powered down to the ground at the first speed.

In addition, the method for driving the shift register unit according to the above embodiment of the present disclosure may further include the following additional technical features.

According to some embodiments of the present disclosure, the method further includes: discharging the second node by a second discharge circuit based on a second level provided by the third voltage terminal that is powered down to the ground at a second speed, under the control of a discharge control signal received by a discharge control terminal, wherein the second speed is substantially less than the first speed.

According to some embodiments of the present disclosure, the method further includes: during a turn-on process, controlling, by the control circuit, the potential of the second node under the control of the second voltage signal received by the second voltage terminal, so that the first discharge circuit is turned on under the control of the potential of the second node, and pulls down the first node and the signal output terminal based on the second level provided by the third voltage terminal; pulling up, by the input circuit, the first node to a first level based on an input signal of the input signal terminal and using a first voltage signal of the first voltage terminal, so that the pull-up circuit is turned on and the control circuit controls the first discharge circuit to be turned off; pulling up, by the pull-up circuit, the signal output terminal to a first level based on a clock signal of the clock signal terminal, so that a corresponding pixel unit is turned on; and pulling down, by the input circuit, the first node to a second level based on a reset signal of the reset signal terminal, so that the control circuit controls the signal output terminal to be reset by the first discharge circuit.

Additional aspects and advantages of the present disclosure will be partly set forth in the following description, and parts of them will become apparent from the following description, or be understood from the practice of the present disclosure.

BRIEF DESCRIPTION OF THE DRAWINGS

The above and/or additional aspects and advantages of the present disclosure will become apparent and readily understood from the following description of embodiments made in conjunction with the accompanying drawings, in which

FIG. 6 is a schematic diagram showing output logic of a shift register unit According to some embodiments of the present disclosure;

FIG. 7 is a schematic diagram showing that a plurality of stages of shift register units are cascaded with each other According to some embodiments of the present disclosure;

FIG. 8 is a schematic diagram showing timing control of a display device According to some embodiments of the present disclosure;

FIG. 9 is a flowchart of a method for driving a shift register unit according to an embodiment of the present disclosure;

DETAILED DESCRIPTION

Figure 1:
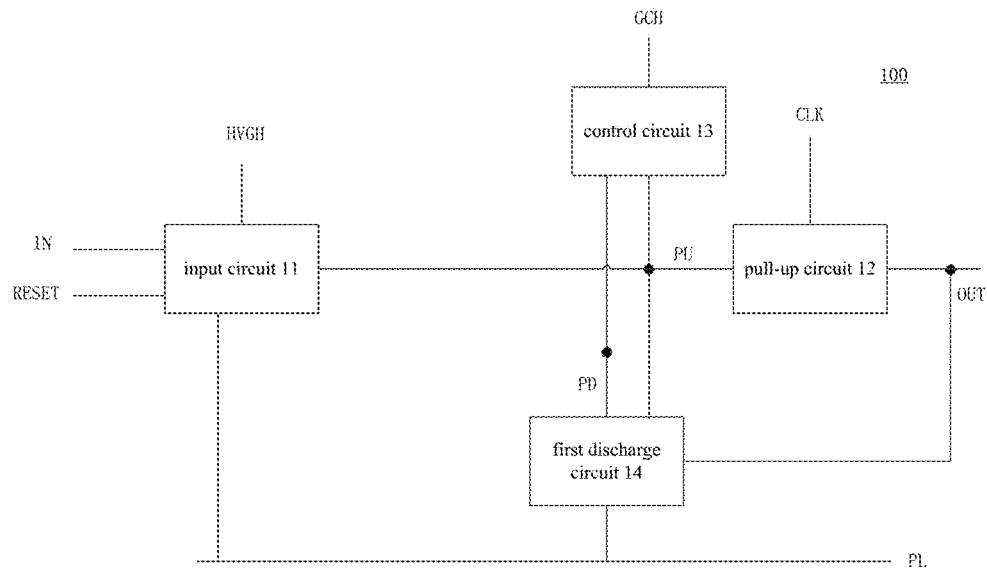
FIG. 1 shows a schematic block view of a shift register unit according to an embodiment of the present disclosure.

The embodiments of the present disclosure are described in detail below, and examples of the embodiments are illustrated in the drawings, in which the same or similar reference numerals indicate the same or similar elements, or elements having the same or similar functions. The embodiments described below with reference to the drawings are illustrative, and are intended to explain the present disclosure, rather than to be construed as its limitations.

A shift register unit and its driving method, a gate driving circuit and a display device of the embodiments of the present disclosure will be described hereinafter with reference to the accompanying drawings.

FIG. 1 is a schematic block diagram of a shift register unit According to some embodiments of the present disclosure. As shown in FIG. 1, a shift register unit 100 of the embodiment of the present disclosure includes an input circuit 11, a pull-up circuit 12, a control circuit 13 and a first discharge circuit 14, for example.

The input circuit 11 is connected to a first voltage terminal HVGH, an input signal terminal IN, a reset signal terminal RESET, a third voltage terminal PL and a first node PU. The input circuit 11 is configured to control a potential of the first node based on a first voltage signal received by the first voltage terminal HVGH, an input signal received by the input signal terminal IN and a reset signal received by the reset signal terminal RESET. The pull-up circuit 12 is connected to the first node PU, a clock signal terminal CLK and a signal output terminal OUT of the shift register unit 100. The pull-up circuit 12 is configured to control an output of the signal output terminal OUT that is connected to a corresponding pixel unit. The control circuit 13 is connected to a second voltage terminal GCH, the first node PU and a second node PD. The control circuit 13 is configured to control a potential of the second node PD based on a second voltage signal received by the second voltage terminal GCH and the potential of the first node PU. The first discharge circuit 14 is connected to the second node PD, a third voltage terminal PL, the first node PU and the signal output terminal OUT. The first discharge circuit 14 is configured to control, after being turned on under the control of the potential of the second node PD, the first node PU and the signal output terminal OUT by using the third voltage terminal PL, so as to discharge the pixel unit, the first node PU and the signal output terminal OUT, the pixel unit being connected to the signal output terminal OUT.

Specifically, during a shutdown process, the control circuit 13 is used to control the potential of the second node PD under the control of the second voltage signal received by the second voltage terminal GCH, so that the first discharge circuit 14 is turned on under the control of the potential of the second node PD. The first discharge circuit 14 first controls the output of the signal output terminal OUT based on a first level provided by the third voltage terminal PL (i.e., outputting the first level provided by the third voltage terminal PL to the signal output terminal OUT), so that the corresponding pixel unit is turned on and discharged. The first discharge circuit 14 then controls the first node PU and the signal output terminal OUT to be discharged based on a second level provided by the third voltage terminal PL that is powered down to the ground at a first speed, such as a first type of low level HVGL.

More specifically, during the shutdown process of a display device, the control circuit 13 may pull up the potential at the second node PD to a first level when the second voltage signal of the second voltage terminal GCH is at an active level. When the potential at the second node PD is at the first level, the first discharge circuit 14 is turned on. After the first discharge circuit 14 is turned on, it may control a potential at the signal output terminal OUT using the first level provided by the third voltage terminal PL, so that the signal output terminal OUT is pulled up to the first level, and the pixel unit connected to the signal output terminal OUT is thus turned on to be discharged. After the pixel unit is discharged, the first discharge circuit 14 further pulls down the potentials at the first node PU and at the signal output terminal OUT using the second level HVGL provided by the third voltage terminal PL that is powered down to the ground at the first speed, so as to discharge the first node PU and the signal output terminal OUT.

That is, the shutdown process may include a first phase and a second phase. The first phase may be also referred to as a pixel discharge phase, and the second phase may be referred to as a discharge phase of the second node PD and the output terminal OUT. Specifically, in the first phase, the second voltage terminal GCH may be made at an active level, and the third voltage terminal PL may provide a high level VGH. During the period in which the potential at the second voltage terminal GCH is at the active level and the first node PU is at a second level, a second voltage signal is transmitted to the second node PD, the potential at the second node PD is pulled up to the first level, and the first discharge circuit 14 is turned on and pulls up the potential at the signal output terminal OUT to the first level using the first level provided by the third voltage terminal PL. Thereby, the corresponding pixel unit is turned on, and the discharge is performed using charges on a storage capacitor of the pixel unit.

After the discharge of the pixel unit is completed, the third voltage terminal PL may be controlled to jump from the first level to the second level which is powered down to the ground at the first speed. At this time, the potential at the second voltage terminal GCH remains at the active level, the potential at the second node PD remains at the first level, and the first discharge circuit 14 remains turned on, and discharges the signal output terminal OUT using the second level provided by the third voltage terminal PL that is powered down to the ground at the first speed, while discharging the first node PU using the second level provided by the third voltage terminal PL that is powered down to the ground at the first speed.

In this way, the shift register unit 100 of the embodiment of the present disclosure is capable of sufficiently removing noise of the pixel units inside the display device and the first node PU and the signal output terminal OUT of the shift register unit 100, thereby effectively avoiding poor screen display such as image sticking after the shutdown due to charge residual inside the display device during the shutdown process, startup flickering and the like, and increasing the product performance. Moreover, the shift register unit is especially applicable to low-frequency driving of an oxide TFT display device.

Furthermore, it can be understood that, "active level" and "inactive level" refer to two potential ranges that do not overlap with each other at a certain node position. For example, "active level" may be a high level, and "inactive level" may be a low level, and vice versa. Similarly, "first level" and "second level" refer to two potential ranges that do not overlap with each other. For example, "first level" may be a high level, and "second level" may be a low level, and vice versa.

Figure 2:
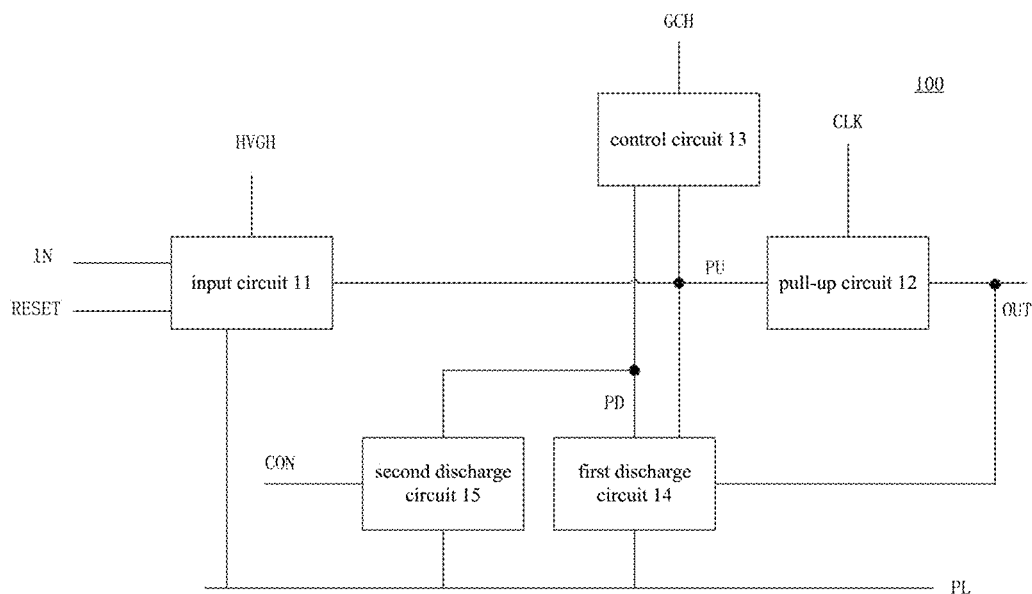
FIG. 2 shows a schematic block view of another shift register unit According to some embodiments of the present disclosure.

Furthermore, according to an embodiment of the present disclosure as shown in FIG. 2, the shift register unit 100 further includes a second discharge circuit 15.

The second discharge circuit 15 is connected to a discharge control terminal CON, the third voltage terminal PL and the second node PD. The second discharge circuit 15 is configured to discharge the second node by using the third voltage terminal under the control of a discharge control signal received by the discharge control terminal.

Specifically, during a shutdown process, the second discharge circuit 15 is used to discharge the second node based on the second level provided by the third voltage terminal PL that is powered down to the ground at a second speed that is substantially less than the first speed, i.e., a second type of low level LVGL, under the control of the discharge control signal received by the discharge control terminal CON.

More specifically, after the first node PU and the output terminal OUT of the shift register unit 100 have been discharged, the second voltage signal of the second voltage terminal GCH may become at an inactive level to stop the pulling up of the potential at the second node PD. At the same time, the discharge control terminal CON may be made at an active level and the third voltage terminal PL may be caused to jump from the second level that is powered down to the ground at the first speed to the second level that is powered down to the ground at the second speed. Thus, the second discharge circuit 15 is turned on and discharges the second node PD using the second level provided by the third voltage terminal PL that is powered down to the ground at the second speed.

That is, the shutdown process may further include a third phase. In the third phase, i.e., after the first node PU and the output terminal OUT of the shift register unit 100 have been discharged based on the embodiment of FIG. 1, the potential of the second voltage terminal GCH may be caused to jump from the active level to the inactive level, while the discharge control terminal CON may be caused to be at the active level and the third voltage terminal PL may be caused to jump from the second level that is powered down to the ground at the first speed to the second level that is powered down to the ground at the second speed. The second speed is substantially less than the first speed. That is to say, in relation to the process of powering down the second level to the ground at the first speed, the process of powering down the second level to the ground at the second speed is more gradual, that is, it requires a longer period of time to drop from the second level to the ground level (usually zero). At this time, the potential at the second node PD is stopped from being pulled up, and the second discharge circuit 15 is turned on and discharges the second node PD using the second type of low level LVGL provided by the third voltage terminal PL.

In this way, the shift register unit 100 of the embodiment of the present disclosure is further capable of sufficiently removing noise of the second node PD of the shift register unit 100 during the shutdown process, thereby effectively avoiding poor screen display such as image sticking after the shutdown due to charge residual inside the display device during the shutdown process, startup flickering and the like, and increasing the product performance.

Figure 3:
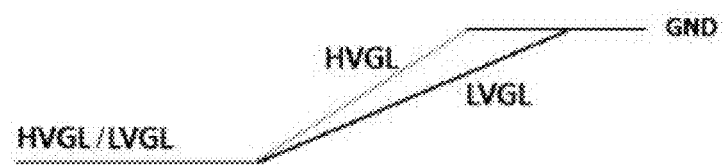
FIG. 3 is a schematic diagram illustrating variation curves of a first type of low level and a second type of low level According to some embodiments of the present disclosure.

It can be understood that, as shown in FIG. 3, the speed at which the second type of low level LVGL is powered down to a ground terminal GND is less than that at which the first type of low level HVGL is powered down to the ground terminal GND. In other words, in the shutdown process, it is possible to power down from the second level such as a low level VGL to the ground terminal GND at different power-down speeds. Specifically, since the second speed is substantially less than the first speed, the power-down speed of the first type of low level HVGL is greater, and the power-down speed of the second type of low level LVGL is relatively smaller. As a result, the first type of low level HVGL reaches the potential of the ground terminal GND earlier than the second type of low level LVGL. Thus, when the second node PD is discharged, more sufficient discharge will be achieved by using the second type of low level LVGL that is powered down more slowly.

Further, According to some embodiments of the present disclosure, during a turn-on process, the input circuit 11 is also used to pull up the first node PU to the first level VGH after the first discharge circuit 14 is turned on, so that the pull-up circuit 12 is turned on and the control circuit 13 controls the first discharge circuit 14 to be turned off. The pull-up circuit 12 is also used to pull up the signal output terminal OUT to the first level VGH, so that the corresponding pixel unit is turned on. The input circuit 11 is further used to pull down the first node PU to the second level VGL, so that the control circuit controls the signal output terminal to be reset by the first discharge circuit.

It should be noted that, in the embodiments of the present disclosure, each of the second levels whose power-down speeds are not defined may be the second level that is powered down to the ground at the first speed. Of course, those skilled in the art can understand that the second level that is powered down to the ground at any other suitable speeds can be also used as actually needed.

Specifically, during the turn-on process of the display device, the control circuit 13 may pull up the potential at the second node PD to the first level when the second voltage signal of the second voltage terminal GCH is at the active level and the signal of the first node PU is at the second level. When the potential at the second node PD is at the first level, the first discharge circuit 14 is turned on. After the first discharge circuit 14 is turned on, the first discharge circuit 14 may pull down the potentials at the first node PU and at the output terminal OUT of the shift register unit 100 using the second level provided by the third voltage terminal PL (for example, the second level may be powered down to the ground at the first speed). Subsequently, the input circuit 11 may pull up the potential at the first node PU using the first voltage signal of the first voltage terminal HVGH when the input signal of the input signal terminal IN is at an active level. When the first node PU is pulled up to the first level such as the high level VGH, the control circuit 13 pulls down the potential of the second node PD using the second level provided by the third voltage terminal PL to control the first discharge circuit 14 to be turned off and the pull-up circuit 12 to be turned on. When being turned on, the pull-up circuit 12 pulls up the potential at the signal output terminal OUT using a clock signal of the clock signal terminal CLK, which in turn turns on the pixel unit connected to the signal output terminal OUT. After the pixel unit completes the operation, the input circuit 11 may also pull down the potential at the first node PU when the reset signal of the reset signal terminal RESET is at an active level, so that the control circuit 13 controls the first discharge circuit 14 to be turned on again, and pulls down the potential at the signal output terminal OUT.

That is, the turn-on process may include a first phase, a second phase, a third phase and a fourth phase. In the turn-on process, the first phase may be an initialization phase, the second phase may be a precharge phase, the third phase may be a current row output phase, and the fourth phase may be a normal output phase of the shift register unit.

Specifically, in the first phase, the second voltage terminal GCH may be made at an active level, and the third voltage terminal PL may provide a second level, such as a low level VGL. During the period in which the potential at the second voltage terminal GCH is at the active level, the control circuit 13 may pull up the potential at the second node PD to a first level, such as a high level VGH. When the potential at the second node PD is pulled up to the high level VGH, the control circuit 13 controls the first discharge circuit 14 to be turned on and to pull down the potential at the signal output terminal OUT to a low level using a low level provided by the third voltage terminal PL, and to pull down the potential at the first node PU to a low level at the same time. In this way, the initialization of the turn-on process is implemented.

In the second phase, the input signal terminal IN may be caused to jump from an inactive level to an active level and the first voltage terminal HVGH is made at a first level. During the period in which the input signal terminal IN is at the active level, the input circuit 11 transmits a first voltage signal of the first voltage terminal HVGH to the first node PU to pull up the potential at the first node PU to a first level, such as a high level VGH. When the potential at the first node PU is pulled up to the high level, the control circuit 13 pulls down the potential of the second node PD to a second level, such as a low level VGL, to control the first discharge circuit 14 to be turned off, and the first discharge circuit 14 thus stops the pulling down of the potentials at the signal output terminal OUT and at the first node PU. Thereby, the first voltage terminal HVGH charges the first node PU, and the potential at the first node PU can be maintained at the high level VGH by a first capacitor C1 connected between the first node PU and the signal output terminal OUT, thereby achieving the charging of the first node PU. At the same time, the pull-up circuit 12 is turned on when the potential at the first node PU is at the high level VGH, and the potential at the signal output terminal OUT is controlled by a clock signal of the clock signal terminal CLK.

In the third phase, the clock signal of the clock signal terminal CLK jumps from a second level (a low level VGL) to a first level (a high level VGH). During the period in which the clock signal of the clock signal terminal CLK is at the first level, the pull-up circuit 12 pulls up the potential at the signal output terminal OUT to the first level using the clock signal of the clock signal terminal CLK. Thus, an output of the current shift register unit is achieved. In addition, it can be understood that the input signal terminal IN can jump from the active level to the inactive level at any time so long as the charging process at the first node PU is completed. For example, the input signal terminal IN may jump from the active level to the inactive level during the period in which the clock signal of the clock signal terminal CLK is at the first level. Also, for example, the input signal terminal IN may jump from the active level to the inactive level before the clock signal of the clock signal terminal CLK jumps to the first level.

In the fourth phase, the clock signal of the clock signal terminal CLK jumps from the first level (the high level VGH) to the second level (the low level VGL) again, and a reset signal of the reset signal terminal RESET jumps from an inactive level to an active level. The signal output terminal OUT follows the clock signal of the clock signal terminal CLK to jump to the second level. At the same time, the input circuit 11 pulls down the potential at the first node PU to a second level, such as a low level VGL. When the potential at the first node PU is at the low level VGL, the pull-up circuit 12 is turned off so that the output terminal OUT does not change with the clock signal terminal CLK. Meanwhile, when the potential at the first node PU is at the low level VGL, the control circuit 13 stops the pulling down of the potential of the second node PD, and the potential of the second node PD is pulled up to the high level VGH again, which turns on the first discharge circuit 14 and pulls down the potentials at the first node PU and at the signal output terminal OUT to the low level VGL. As a result, floating of the signal output terminal OUT can be prevented.

In addition, according to some embodiments of the present disclosure, as shown in FIG. 7, a shift register may be constituted by a plurality of stages of shift register units 100. For example, the plurality of stages of shift register units 100 may include a shift register unit SR1 at a first stage, a shift register unit SR2 at a second stage, a shift register unit SR3 at a third stage, a shift register unit SR4 at a fourth stage, . . . , a shift register unit SRn at an $n^{th}$ stage, . . . .

Except for the shift register unit at the first stage, the input signal terminal of the shift register unit at each of the remaining stages is connected to the signal output terminal of the shift register unit at an immediately preceding stage. In addition, except for the shift register unit at the last stage, the signal output terminal of the shift register unit at each of the remaining stages is connected to the reset signal terminal of the shift register unit at an immediately preceding stage.

That is, when the shift register unit 100 is at the first stage, the input signal terminal IN is connected to a primary input signal line that provides a primary input signal STV. When the shift register unit 100 is not at the first stage, the input signal terminal IN is connected to a signal output terminal $G_{n-1}$ at an immediately preceding stage. When the shift register unit 100 is at the last stage, the reset signal terminal RESET is connected to an input signal line of a last stage for providing an input signal of a last stage. When the shift register unit 100 is not at the last stage, the signal output terminal Gn is connected to the reset signal terminal RESET of the shift register unit at the immediately preceding stage.

Moreover, when the shift register unit 100 is at an odd-numbered stage (e.g., the first stage, the third stage, . . . ), the clock signal received by the clock signal terminal CLK is a first clock signal CLKA, and when the first node PU is at a first level such as a high level, the pull-up circuit 12 pulls up the potential at the signal output terminal OUT using the first clock signal CLKA. In addition, when the shift register unit 100 is at an even-numbered stage (e.g., the second stage, the fourth stage, . . . ), the clock signal received by the clock signal terminal CLK is a second clock signal CLKB, and when the first node PU is at a first level such as a high level, the pull-up circuit 12 pulls up the potential at the signal output terminal OUT using the second clock signal CLKB.

The first clock signal CLKA is one of a positive phase clock signal and an inverted clock signal, and the second clock signal CLKB is the other one of the positive phase clock signal and the inverted clock signal. It should be noted that the first clock signal CLKA and the second clock signal CLKB remain at the second level before jumping to the first level for the first time, and the first clock signal CLKA jumps to the first level prior to the second clock signal CLKB.

Specifically, by taking the shift register unit SRn at the $n^{th}$ stage as an example, the first level is a high level VGH, and the second level is a low level VGL. During the turn-on process, when the clock signal of the shift register unit SRn−1 at the $(n-1)^{th}$ stage jumps from a low level to a high level, the output terminal Gn−1 of the shift register unit SRn−1 at the $(n-1)^{th}$ stage also jumps from a low level to a high level accordingly, that is, the shift register unit SRn−1 at the $(n-1)^{th}$ stage controls a pixel unit of the $(n-1)^{th}$ row to be turned on. At this time, the input signal terminal IN jumps from an inactive level to an active level, and the fourth voltage terminal HVGH charges the first node PU through a second input unit 16 to pull up a potential at the first node PU to a high level. When the potential at the first node PU is pulled up to the high level, a potential of the second node PD is pulled down to a low level, and the first discharge circuit 14 is thus turned off, stopping the pulling down of the potentials at the signal output terminal OUT and at the first node PU. The potential at the signal output terminal OUT is thus controlled by the clock signal of the shift register unit SRn at the $n^{th}$ stage. That is, when the clock signal of the shift register unit SRn at the $n^{th}$ stage is at a low level, the potential at the output terminal OUT is at a low level, and when the clock signal of the shift register unit SRn at the $n^{th}$ stage is at a high level, the potential at the signal output terminal OUT is at a high level.

Thereafter, the clock signal of the shift register unit SRn−1 at the $(n-1)^t$ stage jumps from the high level to the low level, and the clock signal of the shift register unit SRn at the $n^{th}$ stage correspondingly jumps from the low level to the high level. During the period in which the clock signal of the shift register unit SRn at the $n^{th}$ stage is at the high level, the pull-up circuit 12 pulls up the potential at the signal output terminal OUT to a high level using the clock signal of the shift register unit SRn at the $n^{th}$ stage.

Thereafter, the clock signal of the shift register unit SRn at the $n^{th}$ stage jumps from the high level to the low level, and the clock signal of the shift register unit SRn+1 at the $(n+1)^{th}$ stage correspondingly jumps from a low level to a high level. Moreover, the signal output terminal OUT of the shift register unit SRn at the $n^{th}$ stage follows the first clock signal CLKA to jump to a low level. At the same time, the reset signal terminal RESET of the shift register unit SRn at the $n^{th}$ stage jumps from an inactive level to an active level, the potential at the first node PU of the shift register unit SRn at the $n^{th}$ stage is pulled down to a low level, the pull-up circuit 12 of the shift register unit SRn at the $n^{th}$ stage is turned off, and the signal output terminal OUT of the shift register unit SRn at the $n^{th}$ stage does not change with the clock signal of the shift register unit SRn at the $n^{th}$ stage. At the same time, the potential of the second node PD is pulled up to a high level, and the potential at the signal output terminal OUT is thus pulled down to a low level. As a result, the floating of the signal output OUT can be prevented.

Thus, after the primary input signal STV jumps to a high level, the shift register unit SR1 at the first stage charges the first node PU, and performs an output during a period in which the first clock signal CLKA jumps to a high level. Except for the shift register unit SR1 at the first stage, each of the shift register units at the other stages realizes the charging of the first node PU when the shift register unit at an immediately preceding stage performs the output, and performs an output when the shift register unit at the immediately preceding stage stops the output, so that the plurality of stages of shift register units sequentially output high levels, that is, the pixel units of the display device are sequentially turned on row by row.

In addition, according to an embodiment of the present disclosure, as shown in FIG. 8, a voltage of a power supply of the display device may be detected by a power-down circuit 31 that sends a shutdown signal to a timing control chip 32 and a power management circuit 33 when the voltage of the power supply is lower than a preset voltage threshold, so that the timing control chip 32 and the power management circuit 33 controls the shift register unit 100 to enter the shutdown process.

That is, before the shift register unit 100 enters the shutdown process, the display device is in a pre-shutdown state. In the pre-shutdown state, all the signals and power supplies follow a first level such as a high level VGH and a second level such as a first type of low level HVGL to be normally powered down. For example, in the pre-shutdown state, the potential at the second voltage terminal GCH is at an active level, i.e., at the high level VGH, and the potential at the second voltage terminal GCH follows the high level VGH to be normally powered down to the ground terminal GND (that is, the voltage drops). Since the potential at the second voltage terminal GCH is at the active level, the potential at the second node PD also follows the high level VGH to be normally powered down to the ground terminal GND. At the same time, the first type of low level HVGL provided by the third voltage terminal PL is normally powered down to the ground terminal GND (that is, the voltage raises). Since the potential at the second node PD remains at a high level at this time, the first discharge circuit 14 is turned on, and the first node PU and the signal output terminal OUT follow the first type of low level HVGL to be normally powered down to the ground terminal GND. Furthermore, the fourth voltage terminal GCL and the discharge control terminal CON are at inactive levels, that is, at low levels, and the fourth voltage terminal GCL and the discharge control terminal CON follow the first type of low level HVGL to be normally powered down to the ground terminal GND.

Thereafter, when the voltage of the power supply of the display device drops to a preset voltage threshold, for example, a normal voltage of the power supply being 3.3 V and the preset voltage threshold being 2.7 V, the power-down circuit 31 sends a shutdown signal to the timing control chip 32 and the power management circuit 33, and the timing control chip 32 and the power management circuit 33 control the shift register unit 100 to enter the shutdown process. After entering the shutdown process, the shift register unit 100 can implement the shutdown control of the foregoing embodiments.

In conjunction with the embodiment of FIG. 8, the power-down circuit 31 is connected to each of the timing control chip 32 and the power management circuit 33, the power management circuit 33 is connected to a level converting circuit 34, and the timing control chip 32 is connected to the shift register unit 100 via the level converting circuit 34. Specifically, the power management circuit 33 may control the level converting circuit 34 to perform level conversion, so as to be able to provide the high level VGH, the first type of low level HVGL and the second type of low level LVGL. The timing control chip 32 can output a timing control signal to the shift register unit 100 through the level converting circuit 34.

It should be noted that the plurality of stages of shift register units 100 can control a plurality of corresponding rows of pixel units, respectively. During the shutdown process, the plurality of stages of shift register units 100 can perform the shutdown control simultaneously. For example, the output terminals of the plurality of stages of shift register units 100 can simultaneously output high levels to control the plurality of rows of pixel units to be turned on. In this way, the plurality of rows of pixel units of the display device are all turned on while being discharged. The first nodes PU and the output terminals OUT of the plurality of stages of shift register units 100 can be also discharged simultaneously. The second nodes PD of the plurality of stages of shift register units 100 can be simultaneously discharged as well. Thereby, rapid discharge inside the entire display device can be achieved.

Figure 4:
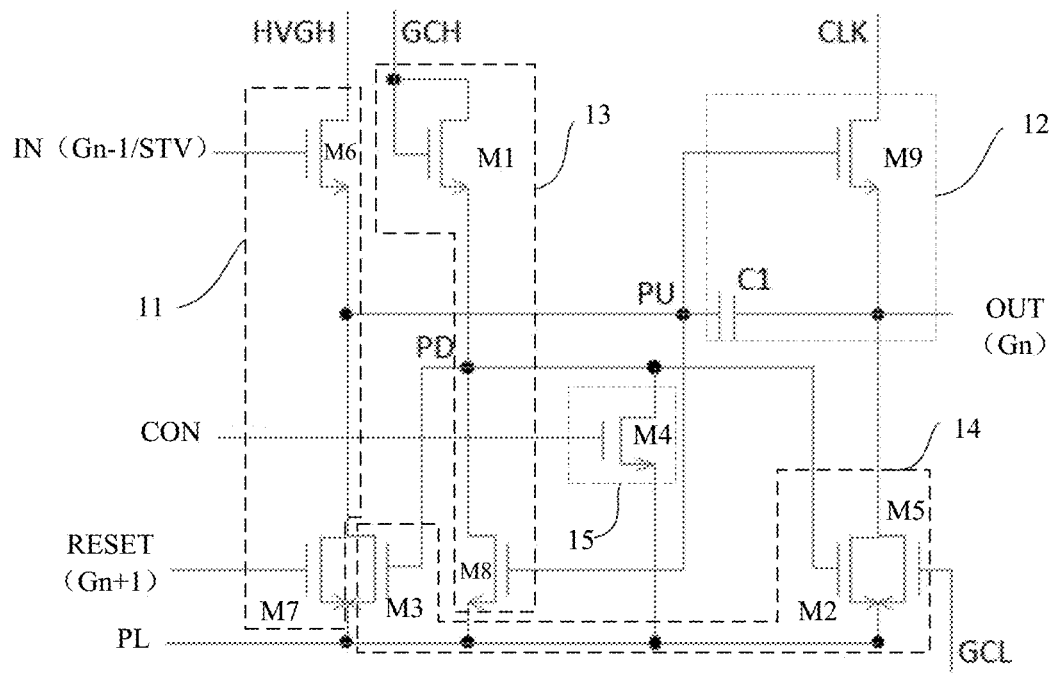
FIG. 4 shows a schematic circuit diagram of a shift register unit According to some embodiments of the present disclosure.

In order to clearly explain the previous embodiment, the present embodiment provides an example of a circuit configuration of a shift register unit. FIG. 4 is a schematic circuit diagram of a shift register unit according to an embodiment of the present disclosure.

In conjunction with the embodiment of FIG. 4, the control circuit 13 includes a first transistor M1 and an eighth transistor M8. A gate electrode of the first transistor M1 and a first electrode of the first transistor M1 are both connected to the second voltage terminal GCH, and a second electrode of the first transistor M1 is connected to the second node PD. A gate electrode of the eighth transistor M8 is connected to the first node PU, a first electrode of the eighth transistor M8 is connected to the second node PD, and a second electrode of the eighth transistor M8 is connected to the third voltage terminal PL.

Further, as shown in FIG. 4, the first discharge circuit 14 includes a second transistor M2 and a third transistor M3. A gate electrode of the second transistor M2 is connected to the second node PD, a first electrode of the second transistor M2 is connected to the signal output terminal OUT, and a second electrode of the second transistor M2 is connected to the third voltage terminal PL. A gate electrode of the third transistor M3 is connected to the second node PD, a first electrode of the third transistor M3 is connected to the first node PU, and a second electrode of the third transistor M3 is connected to the third voltage terminal PL.

Further, as shown in FIG. 4, the first discharge circuit 14 is also connected to the fourth voltage terminal GCL. The first discharge circuit 14 further includes a fifth transistor M5. A gate electrode of the fifth transistor M5 is connected to the fourth voltage terminal GCL, a first electrode of the fifth transistor M5 is connected to the signal output terminal OUT, and a second electrode of the fifth transistor M5 is connected to the third voltage terminal PL.

That is, the fifth transistor M5 is turned on when the fourth voltage terminal GCL is at an active potential. Thus, after entering the shutdown process, the fifth transistor M5 may control the potential at the signal output terminal OUT together with the second transistor M2.

Specifically, during the shutdown process of the display device, when the second voltage terminal GCH is at an active level and the third voltage terminal PL provides a high level VGH, the fourth voltage terminal GCL may be also made at an active potential. At this time, the fifth transistor M5 and the second transistor M2 are turned on simultaneously, and the potential at the signal output terminal OUT is thus pulled up to a high level by the fifth transistor M5 and the second transistor M2, so as to discharge the pixel unit.

After the pixel unit is discharged, like the second voltage terminal GCH, the fourth voltage terminal GCL remains at the active potential, and the fifth transistor M5 and the second transistor M2 remains in a turn-on state simultaneously. Thus, the signal output terminal OUT is discharged through the fifth transistor M5 and the second transistor M2.

After the output terminal OUT and the first node PU are discharged, the fourth voltage terminal GCL also follows the second voltage terminal GCH to jump from the active level to an inactive level, the fifth transistor M5 is turned off, and the signal output terminal OUT is stopped from being discharged by the fifth transistor M5.

Further, as shown in FIG. 4, the second discharge circuit 15 includes a fourth transistor M4. A gate electrode of the fourth transistor M4 is connected to the discharge control terminal CON, a first electrode of the fourth transistor M4 is connected to the second node PD, and a second electrode of the fourth transistor M4 is connected to the third voltage terminal PL.

Further, as shown in FIG. 4, the pull-up circuit 12 includes a ninth transistor M9 and a first capacitor C1. A gate electrode of the ninth transistor M9 is connected to the input circuit 11 and thus to the first node PU, a first electrode of the ninth transistor M9 is connected to the clock signal terminal CLK, and a second electrode of the ninth transistor M9 is connected to the signal output terminal OUT. One end of the first capacitor C1 is connected to the first node PU, and the other end of the first capacitor C1 is connected to the signal output terminal OUT.

Further, as shown in FIG. 4, the input circuit 11 includes a sixth transistor M6 and a seventh transistor M7. A gate electrode of the sixth transistor M6 is connected to the input signal terminal IN, a first electrode of the sixth transistor M6 is connected to the first voltage terminal HVGH, and a second electrode of the sixth transistor M6 is connected to the first node PU. A gate electrode of the seventh transistor M7 is connected to the reset signal terminal RESET, a first electrode of the seventh transistor M7 is connected to the first node PU, and a second electrode of the seventh transistor M7 is connected to the third voltage terminal PL.

According to a particular embodiment of the present disclosure, the first to the ninth transistors M1 to M9 are all thin film transistors, for example. More specifically, the first to the ninth transistors M1 to M9 may be all N-type thin film transistors, for example.

Figure 5:
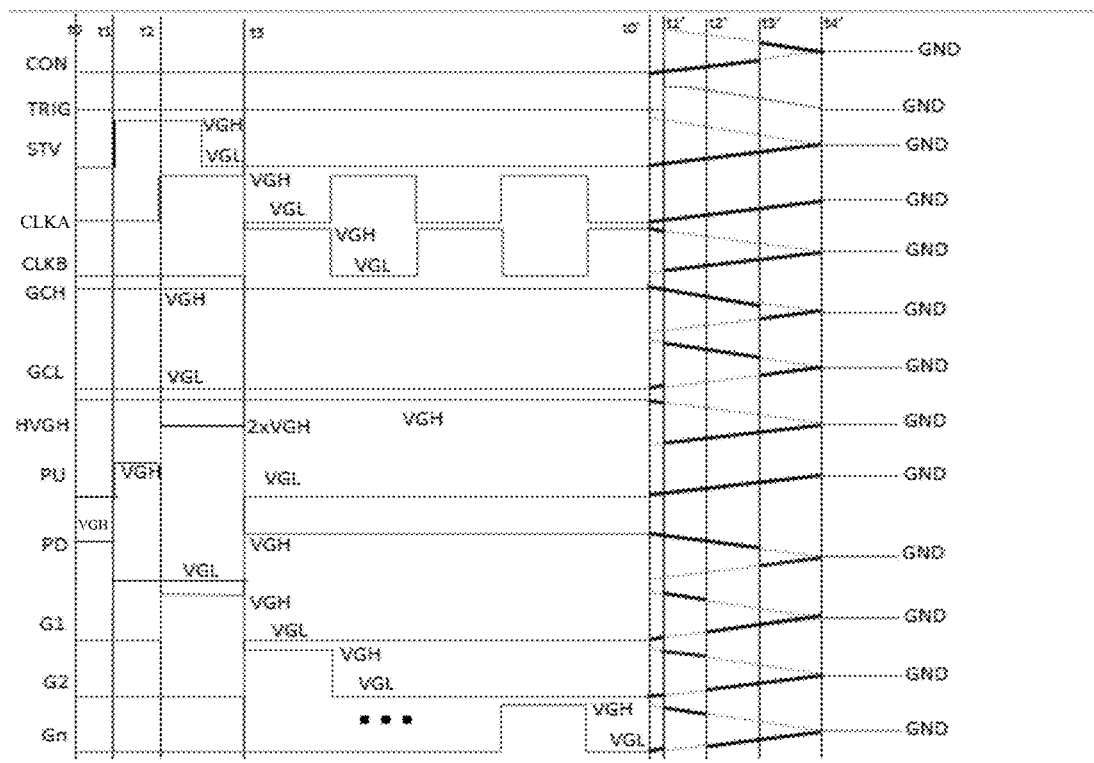
FIG. 5 is a schematic diagram showing output timing of a shift register unit According to some embodiments of the present disclosure.

The operation principle of the shift register unit of the embodiment of FIG. 4 will be described below with reference to the output timing diagram shown in FIG. 5 and the output logic diagram shown in FIG. 6. The first transistor M1 to the ninth transistor M9 may be all N-type thin film transistors, and VSS in FIG. 6 represents the second level VGL.

The turn-on process will be described first. In combination with the embodiment of FIG. 4 to FIG. 6, t0~t1 in the turn-on process is the initialization phase, t1~t2 is the precharge phase, t2~t3 is the current row output phase, and t3~ is the normal output phase of the shift register unit.

During the period from t0 to t1, the second voltage signal of the second voltage terminal GCH is at a high level VGH; the third voltage terminal PL provides a low level VGL that may be a first type of low level HVGL; the input signal of the input signal terminal IN is at a low level VGL, that is, the primary input signal STV or the signal of the signal output terminal Gn−1 at the preceding stage is at the low level VGL; the reset signal of the reset signal terminal RESET is at a low level VGL, that is, the signal of the last stage or the signal of the signal output terminal Gn+1 of the subsequent stage is at the low level; and the fourth voltage signal of the fourth voltage terminal GCL and the discharge control signal of the discharge control terminal CON are both at low levels VGL. Additionally, the first clock signal CLKA and the second clock signal CLKB are both at low levels VGL, and the first voltage signal of the first voltage terminal HVGH is at a high level VGH.

During this period, the first transistor M1 is turned on, and the potential at the second node PD is pulled up to the high level VGH. Thus, the second transistor M2 and the third transistor M3 are both turned on, the potential at the output terminal OUT is pulled down to a low level VGL, and the potential at the first node PU is pulled down to a low level VGL. Thereby, the initialization of the turn-on process is implemented.

It can be understood that each stage of the shift register unit can perform the initialization of the turn-on process at any time prior to entering the precharge phase. In other words, the plurality of stages of shift register units can perform the initialization of the turn-on process simultaneously or one by one.

At time t1, the input signal terminal IN jumps to the high level VGH, that is, the primary input signal STV or the signal of the signal output terminal Gn−1 at the preceding stage jumps to the high level VGL. Moreover, during the period from t1 to t2, the second voltage terminal GCH is at the high level VGH, the third voltage terminal PL provides the low level VGL, the input signal terminal IN is at the high level VGH, and the reset signal terminal RESET is at the low level VGL, that is, the input signal of the last stage or the signal of the signal output terminal Gn+1 of the subsequent stage is at the low level VGL, and the fourth voltage terminal GCL and the discharge control terminal CON are both at low levels VGL. In addition, the clock signal of the clock signal terminal CLK is at the low level VGL, and the first voltage terminal HVGH is at the high level VGH.

During this period, when the input signal terminal IN jumps to the high level VGH, the sixth transistor M6 is turned on. Since a turn-on voltage drop of the third transistor M3 is much greater than a turn-on voltage drop of the sixth transistor M6, the potential at the first node PU is equivalent to being pulled up to the high level VGH. Thus, the eighth transistor M8 is turned on. Since a turn-on voltage drop of the eighth transistor M8 is much smaller than a turn-on voltage drop of the first transistor M1, the potential of the second node PD is equivalent to being pulled down to the low level VGL. Thus, the second transistor M2 and the third transistor M3 are turned off, and stop the pulling down of the potentials at the output terminal OUT and at the first node PU, respectively. Thereby, the first voltage terminal HVGH charges the first node PU through the sixth transistor M6, and the potential at the first node PU may be maintained at the high level VGH by connecting the first capacitor C1 to the first node PU. At the same time, the ninth transistor M9 is turned on, and the potential at the signal output terminal OUT is controlled by the first clock signal CLKA or the second clock signal CLKB. Assuming that it is controlled by the first clock signal CLKA, since the first clock signal CLKA is at the low level at this time, the potential at the signal output terminal OUT remains at the low level. Thereby, the precharge of the turn-on process can be achieved.

At time t2, the first clock signal CLKA jumps to the high level, and the second clock signal CLKB is at the low level. Moreover, during the period from t2 to t3, the second voltage terminal GCH is at a high level VGH; the third voltage terminal PL provides a low level VGL; the reset signal terminal RESET is at a low level VGL, that is, the input signal of the last stage or a signal of the signal output terminal Gn+1 of a subsequent stage is at a low level VGL; and the fourth voltage terminal GCL and the discharge control terminal CON are both at low levels VGL. Additionally, the first clock signal CLKA is at the high level and the second clock signal CLKB is at the low level, and the first voltage terminal HVGH is at the high level VGH. If the input signal terminal IN is connected to the primary input signal line, the primary input signal STV jumps to the low level VGL during the period from t2 to t3, and if the input signal terminal IN is connected to the signal output terminal Gn−1 of the immediately preceding stage, the signal output terminal Gn−1 of the immediately preceding stage jumps to the low level VGL at time t2.

During this period, the potential at the first node PU changes to be twice the high level VGH, the potential of the second node PD is maintained at the low level VGL, and the signal output terminal OUT outputs a high level VGH under the control of the first clock signal CLKA, and the pixel unit of the corresponding row is turned on. Thus, an output of the current row is achieved.

At time t3, the first clock signal CLKA jumps to the low level VGL, and the second clock signal CLKB jumps to the high level VGH. According to the foregoing embodiments, when the first clock signal CLAK jumps to the low level VGL, the signal output terminal OUT of the shift register unit at the current stage outputs a low level VGL under the control of the first clock signal CLKA, and the signal output terminal OUT of the shift register unit at the subsequent stage outputs a high level VGH under the control of the second clock signal CLKB.

Thus, after time t3, the second voltage terminal GCH is at the high level VGH, the third voltage terminal PL provides the low level VGL, the reset signal terminal RESET is at the high level VGH, that is, the input signal of the last stage or the signal of the signal output terminal Gn+1 of the subsequent stage is at the high level VGH, and the fourth voltage terminal GCL and the discharge control terminal CON are both at the low levels VGL. Additionally, the first voltage terminal HVGH is at the high level VGH.

When the reset signal terminal RESET is at the high level VGH, the seventh transistor M7 is turned on, and the potential at the first node PU is pulled down to the low level VGL. At this time, the ninth transistor M9 is turned off, and the output terminal OUT does not change with the first clock signal CLKA. At the same time, the eighth transistor M8 is turned off, the pulling down of the potential of the second node PD is stopped, and the potential of the second node PD is pulled up to a high level VGH due to the turning on of the first transistor M1. Thus, the second transistor M2 and the third transistor M3 are turned on to pull down the potentials at the first node PU and at the signal output terminal OUT to the low levels VGL. As a result, the floating of the signal output terminal OUT can be prevented.

Thereafter, the first clock signal CLKA and the second clock signal CLKB are switched between the high and low levels, and the first clock signal CLKA and the second clock signal CLKB are maintained at opposite levels at the same time, and the plurality of stages of shift register units sequentially outputs the high levels, that is, the pixel units of the display device are sequentially turned on row by row.

Then, the shutdown process will be described. In combination with the embodiment of FIG. 4 to FIG. 6, t0'~t1' is a pre-shutdown phase, and in the shutdown process, t1'~t2' is a pixel discharge phase, t2'~t3' is a discharge phase of the second node PD and the signal output terminal OUT, t3'~t4' is a discharge phase of the first node PU, and t4'~ is a full shutdown phase.

During the period from t0' to t1', all the signals and power supplies follow the high level VGH and the first type of low level HVGL to be normally powered down. By way of example, the second voltage terminal GCH is powered down from the high level VGH to the ground terminal GND; the third voltage terminal PL is powered down from the low level VGL to the ground terminal GND at a first speed; the input signal terminal IN is powered down from the low level VGL to the ground terminal GND at the first speed; the fourth voltage terminal GCL and the discharge control terminal CON are both powered down from low levels VGL to the ground terminal GND at the first speed; the first clock signal CLKA is powered down from the low level VGL to the ground terminal GND at the first speed; the second clock signal CLKB is powered down from the high level VGH to the ground terminal GND; the first voltage terminal HVGH is powered down from the high level VGH to the ground terminal GND; and the signal output terminals OUT, that is, G1, G2, Gn, are powered down from the low levels VGL to the ground terminal GND at the first speed. Moreover, the second node PD is powered down from the high level VGH to the ground terminal GND, and the first node PU is powered down from the low level VGL to the ground terminal GND at the first speed.

At time t1', a voltage input to the power-down circuit 31 drops below a preset voltage threshold, and the power-down circuit 31 outputs a shutdown signal to the timing control chip 32 and the power management circuit 33, so that the timing control chip 32 and the power management circuit 33 initiate a shutdown timing which is provided to the shift register unit in accordance with the signals and power supplies defined in FIGS. 9 and 10.

During the period from t1' to t2', the third voltage terminal PL provides a high level VGH, the second voltage terminal GCH is at a high level VGH, and the fourth voltage terminal GCL jumps to a high level VGH at the same time. Moreover, during the period from t1' to t2', the discharge control terminal CON is at a low level VGL, the input signal terminal IN jumps from a low level VGL to a high level VGH, the first voltage terminal HVGH is at a low level VGL, the reset signal terminal RESET jumps from a low level VGL to a high level VGH, and the signal output terminal OUT jumps from a low level VGL to a high level VGH. In addition, the first clock signal CLKA and the second clock signal CLKB are both at low levels VGL.

During this period, the first transistor M1 is turned on, the potential at the second node PD is pulled up to a high level GCH. Thus, the second transistor M2 and the third transistor M3 are turned on. At the same time, the fifth transistor M5 is turned on. Thus, the potential at the signal output terminal OUT is pulled up to a high level using the high level VGH provided by the third voltage terminal PL, so that a pixel unit is turned on, and electric charges on the storage capacitor of the pixel unit are discharged, thereby realizing that all the signal output terminals output high levels during the period from t1' to t2' and the charges on the storage capacitors of the pixel unit are discharged. When the signal output terminal OUT outputs a high level, since the first voltage terminal HVGH is at a low level, the first node PU can be kept at a low level.

During the period from t2' to t3', the third voltage terminal PL provides a first type of low level HVGL, and the second voltage terminal GCH is at the high level VGH. At the same time, the fourth voltage terminal GCL is at the high level VGH, the discharge control terminal CON is at the low level VGL, the input signal terminal IN jumps to the low level VGL, the first voltage terminal HVGH is at the low level VGL, and the reset signal terminal RESET jumps to the low level VGL, that is, G1, G2, Gn jump to the low level VGL. In addition, the first clock signal CLKA and the second clock signal CLKB are both at the low levels VGL.

During this period, the first transistor M1 is turned on, the potential at the second node PD is pulled up to the high level VGH. The second transistor M2 and the third transistor M3 are thus turned on, and the fifth transistor M5 is turned on at the same time. Thus, the output terminal OUT and the first node PU are discharged using the first type of low level HVGL provided by the third voltage terminal PL, thereby discharging the second node PD and the signal output terminal OUT.

During the period from t3' to t4', the third voltage terminal PL provides a second type of low level LVGL, the discharge control terminal CON jumps to the high level VGH, and the second voltage terminal GCH jumps to the low level VGL. At the same time, the fourth voltage terminal GCL jumps to the low level, the input signal terminal IN is at the low level VGL, the first voltage terminal HVGH is at the low level, and the reset signal terminal RESET is at the low level VGL, that is, G1, G2, Gn are all at the low levels VGL. Additionally, the first clock signal CLKA and the second clock signal CLKB are both at the low levels VGL.

During this period, the first transistor M1 is turned off, and the potential at the second node PD is thus stopped from being pulled up by the first transistor M1. At the same time, the fourth transistor M4 is turned on to discharge the second node PD using the second type of low level LVGL provided by the third voltage terminal PL.

Thereby, during the period from t3' to t4', since the first type of low level HVGL jumps to the second type of low level LVGL, a voltage across the fourth transistor M4 is increased, thereby achieving the effective discharge of the second node PD.

After time t4' (t4'~), all the signals and power supplies are powered down to the ground terminal GND for a full shutdown.

It should be noted that "high level" and "low level" of the embodiments of the present disclosure refer to two logic states represented by potential ranges at a certain node position, respectively. For example, a high level may refer to a potential of about 20V, and a low level refer to a potential of about −10V. It can be understood that a specific potential range can be set as desired in a specific application scenario, and that the potential ranges of "high level" and "low level"

may also be different at different node positions, and they are not limited in the embodiments of the present disclosure.

Correspondingly, the term "pull up" in the embodiments of the present disclosure refers to raising the level at a corresponding node to a high level, and the term "pull-down" refers to lowering the level at the corresponding node to a low level. It can be understood that "pull up" and "pull down" as mentioned above can be realized by directional movement of electric charges, and thus can be implemented by means of an electronic component having the corresponding function, or a combination thereof, and they are not limited in the embodiments of the present disclosure.

In summary, according to the shift register unit proposed in the embodiments of the present disclosure, the control circuit controls the potential of the second node based on the second voltage signal received by the second voltage terminal and the signal of the first node, and the first discharge circuit controls, after being turned on under the control of the potential of the second node, the first node and the signal output terminal by using the third voltage terminal, so that the pixel unit connected to the signal output terminal as well as the first node and the signal output terminal are discharged, so as to ensure the sufficient noise removal inside the display device during the shutdown process, which effectively avoids the poor screen display such as image sticking after the shutdown due to charge residual inside the display device during the shutdown process, startup flickering and the like, and increases product performance.

Based on the above embodiment, the present disclosure further provides a gate driving circuit that includes a plurality of stages of shift register units. That is to say, a plurality of stages of the shift register units as described above may be cascaded with each other to form a gate driving circuit, i.e., a gate drive on array (GOA) circuit.

Except for the shift register unit at a first stage, the input signal terminal of the shift register unit at each of the remaining stages is connected to the signal output terminal of the shift register unit at an immediately preceding stage; and except for the shift register unit at the last stage, the signal output terminal of the shift register unit at each of the remaining stages is connected to the reset signal terminal of the shift register unit at an immediately preceding stage.

Specifically, as shown in FIG. 7, the plurality of stages of the shift register units may be a shift register unit SR1 at a first stage, a shift register unit SR2 at a second stage, a shift register unit SR3 at a third stage, a shift register unit SR4 at a fourth stage, . . . , a shift register unit SRn at an $n^{th}$ stage, respectively.

When the shift register unit is at the first stage, the input signal terminal IN of this shift register unit is connected to a primary input signal line that provides a primary input signal STV; when the shift register unit is not at the first stage, the input signal terminal IN of this shift register unit is connected to a signal output terminal Gn−1 at an immediately preceding stage; when the shift register unit is at the last stage, the reset signal terminal RESET of this shift register unit is connected an input signal line of a last stage that provides an input signal of a last stage; and when the shift register unit is not at the last stage, the reset signal terminal RESET of this shift register unit is connected to the signal output terminal Gn+1 at a subsequent stage.

When the shift register unit is located at an odd-numbered stage such as the first stage, the third stage, . . . , the clock signal received by the clock signal terminal CLK of the shift register unit is a first clock signal CLKA, and the pull-up circuit of the shift register unit pulls up the potential at the signal output terminal OUT using the first clock signal CLKA when the first node PU is at a first level, such as a high level. In addition, when the shift register unit is located at an even-numbered stage such as the second stage, the fourth stage, . . . , the clock signal received by the clock signal terminal CLK of the shift register unit is a second clock signal CLKB, and the pull-up circuit of the shift register unit pulls up the potential at the signal output terminal OUT using the second clock signal CLKB when the first node PU is at a first level such as a high level.

The first clock signal CLKA is one of a positive phase clock signal and an inverted clock signal, and the second clock signal CLKB is the other one of the positive phase clock signal and the inverted clock signal. It should be noted that the first clock signal CLKA and the second clock signal CLKB remain at the second level before jumping to the first level for the first time, and the first clock signal CLKA jumps to the first level prior to the second clock signal CLKB.

The gate driving circuit provided according to the embodiment of the present disclosure is capable of ensuring the sufficient noise removal inside the display device during the shutdown process through the plurality of stages of shift register units, which effectively avoids poor screen display such as image sticking after the shutdown due to charge residual inside the display device during the shutdown process, startup flickering and the like, and increases the product performance.

Based on the above-mentioned embodiment, the present disclosure further provides a display device that includes the gate driving circuit of the aforementioned embodiments.

According to some embodiments of the present disclosure, as shown in FIG. 8, the display device further includes a power-down circuit 31, a timing control chip 32, and a power management circuit 33. The power-down circuit 31 is connected to each of the timing control chip 32 and the power management circuit 33. The power-down circuit 31 is configured to detect a voltage of a power supply of the display device, and to send a shutdown signal to the timing control chip 32 and the power management circuit 33 when the voltage of the power supply is lower than a preset voltage threshold. The timing control chip 32 and the power management circuit 33 control the shift register unit to enter a shutdown process according to the shutdown signal.

That is, before the shift register unit 100 enters the shutdown process, the display device is in a pre-shutdown state. In the pre-shutdown state, all the signals and power supplies follow the first level such as a high level VGH and the second level such as the first type of low level HVGL to be normally powered down. Thereafter, when the voltage of the power supply of the display device drops to a preset voltage threshold, for example, a normal voltage of the power supply being 3.3 V and the preset voltage threshold being 2.7 V, the power-down circuit 31 sends the shutdown signal to the timing control chip 32 and the power management circuit 33, and the timing control chip 32 and the power management circuit 33 control the shift register unit 100 to enter the shutdown process. After entering the shutdown process, the shift register unit 100 can implement the described shutdown control of the foregoing embodiments.

In conjunction with the embodiment of FIG. 8, the power management circuit 33 is also connected to a level converting circuit 34, and the timing control chip 32 is connected to the shift register unit 100 via the level converting circuit 34. Specifically, the power management circuit 33 may control the level converting circuit 34 to perform level conversion, so as to be able to provide the high level VGH, the first type of low level HVGL, and the second type of low level LVGL.

The timing control chip 32 can output a timing control signal to the shift register unit 100 through the level converting circuit 34.

The display device provided according to the embodiment of the present disclosure is capable of ensuring sufficient noise removal inside the display device during the shutdown process through the plurality of stages of shift register units of the gate drive circuit, which effectively avoids poor screen display such as image sticking after the shutdown due to charge residual inside the display device during the shutdown process, startup flickering and the like, and increases the product performance.

Based on the above embodiment, the present disclosure further provides a method for driving a shift register unit.

FIG. 9 is a flowchart of a method for driving a shift register unit According to some embodiments of the present disclosure. As shown in FIG. 9, the method for driving the shift register unit includes the following steps S1 to S3.

In step S1, during a shutdown process, the control circuit controls a potential of the second node under the control of a second voltage signal received by the second voltage terminal, so that the first discharge circuit is turned on under the control of the potential of the second node, and controls an output of the signal output terminal based on a first level provided by the third voltage terminal, so as to turn on and discharge a corresponding pixel unit.

In step S2, the first discharge circuit controls the first node and the signal output terminal to be discharged based on a second level provided by the third voltage terminal that is powered down to the ground at a first speed.

Figure 10:
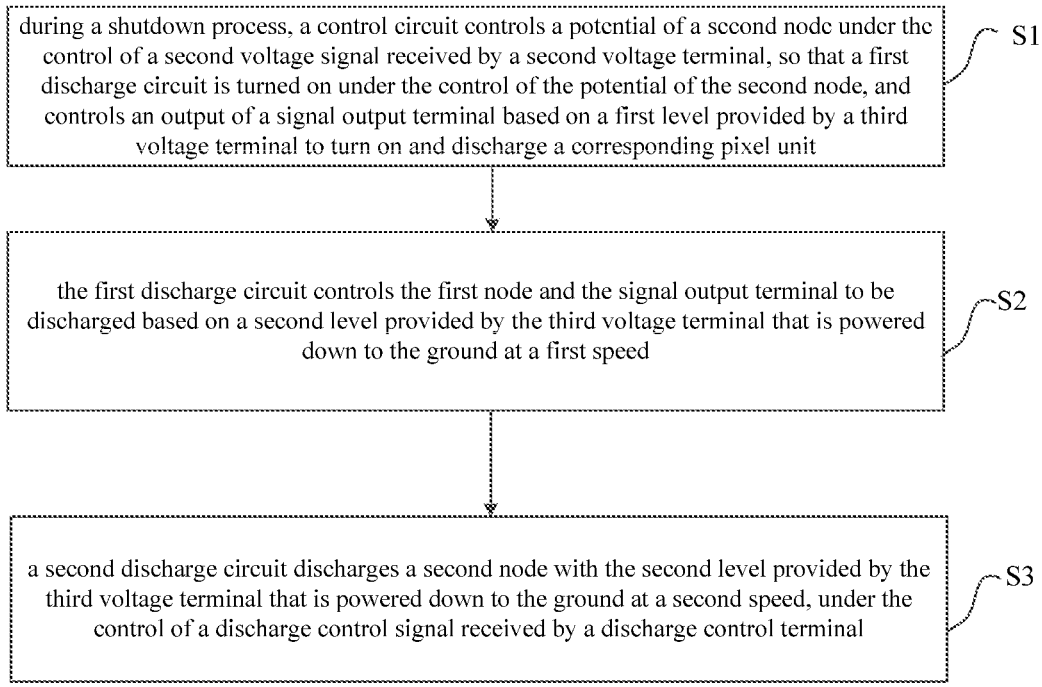
FIG. 10 is another flowchart of a method for driving a shift register unit according to another embodiment of the present disclosure.

According to some embodiments of the present disclosure, as shown in FIG. 10, the method for driving the shift register unit further includes a step S3.

In step S3, a second discharge circuit discharges the second node based on the second level provided by the third voltage terminal that is powered down to the ground at a second speed that is substantially less than the first speed, under the control of a discharge control signal received by a discharge control terminal.

Figure 11:
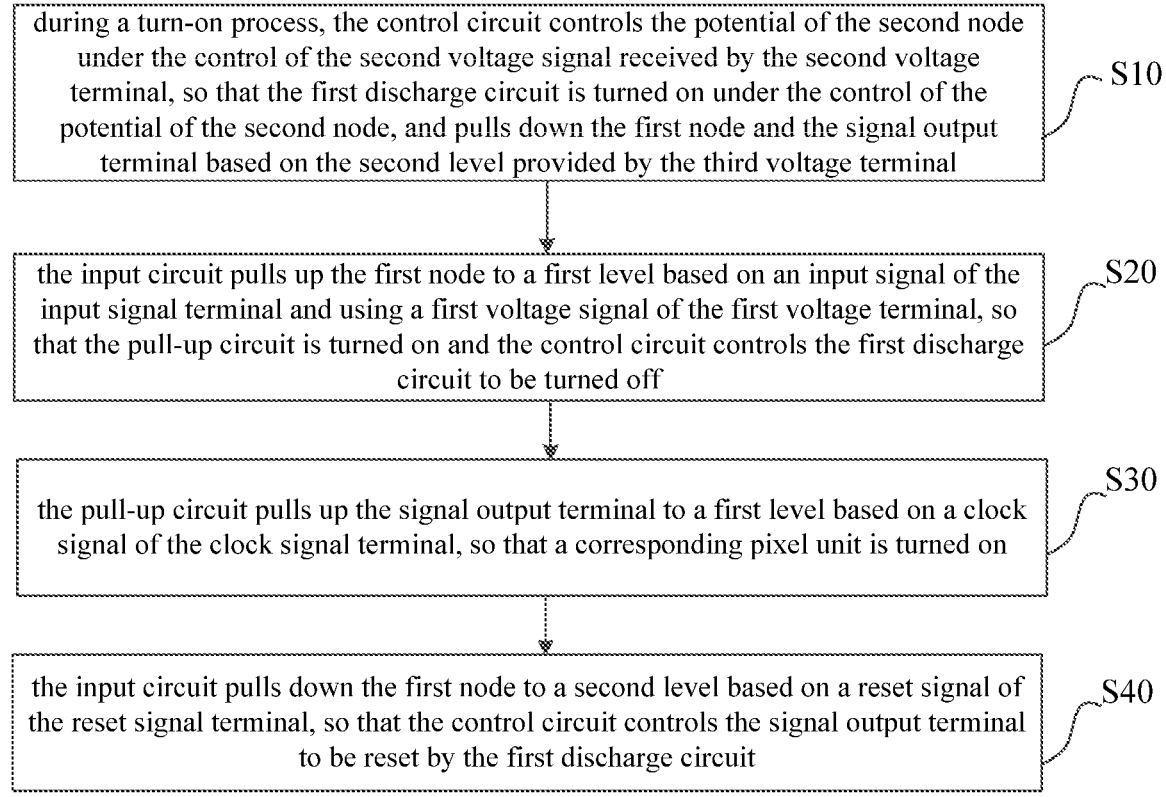
FIG. 11 is yet another flowchart of a method for driving a shift register unit according to yet another embodiment of the present disclosure.

According to some embodiments of the present disclosure, as shown in FIG. 11, the method for driving the shift register unit further includes the following steps S10 to S40.

In step S10, during a turn-on process, the control circuit controls the potential of the second node under the control of the second voltage signal received by the second voltage terminal, so that the first discharge circuit is turned on under the control of the potential of the second node, and pulls down the first node and the signal output terminal based on the second level provided by the third voltage terminal.

In step S20, the input circuit pulls up the first node to a first level based on an input signal of the input signal terminal and using a first voltage signal of the first voltage terminal, so that the pull-up circuit is turned on and the control circuit controls the first discharge circuit to be turned off.

In step S30, the pull-up circuit pulls up the signal output terminal to a first level based on a clock signal of the clock signal terminal, so that a corresponding pixel unit is turned on.

In step S40, the input circuit pulls down the first node to a second level based on a reset signal of the reset signal terminal, so that the control circuit controls the signal output terminal to be reset by the first discharge circuit.

It should be noted that the foregoing explanation of the embodiments of the shift register unit is also applicable to the method for driving the shift register unit of this embodiment, and details are not described herein again.

According to the method for driving the shift register unit proposed in the embodiment of the present disclosure, during the shutdown process, the control circuit controls the potential of the second node under the control of the second voltage signal received by the second voltage terminal, so that the first discharge circuit is turned on under the control of the potential of the second node. Moreover, the first discharge circuit controls the output of the signal output terminal based on the first level provided by the third voltage terminal, so that the corresponding pixel unit is turned on and discharged. Furthermore, the first discharge circuit controls the first node and the signal output terminal to be discharged based on the second level provided by the third voltage terminal that is powered down to the ground at the first speed. Consequently, the sufficient noise removal inside the display device is ensured during the shutdown process, which effectively avoids poor screen display such as image sticking after the shutdown due to charge residual inside the display device during the shutdown process, startup flickering and the like, and increases the product performance.

In the description of the present specification, the description with reference to the terms "one embodiment", "some embodiments", "example", "specific example", "some examples" or the like means that specific features, structures, materials or characteristics described in connection with the embodiment or example are contained in at least one embodiment or examples of the present disclosure. In the present specification, the schematic representation of the above terms is not necessarily directed to the same embodiment or example. Furthermore, the specific features, structures, materials, or characteristics described may be combined in a suitable manner in any one or more embodiments or examples. In addition, various embodiments or examples described in the specification, as well as features of various embodiments or examples, may be integrated and combined without contradicting each other.

Moreover, the terms "first" and "second" are used for descriptive purposes only, and are not to be construed as indicating or implying a relative importance or implicitly indicating the number of technical features indicated. Thus, a feature defined by "first" or "second" may include at least one of the features, either explicitly or implicitly. In the description of the present disclosure, "a plurality" means that the number is at least two, such as two, three, etc., unless specifically defined otherwise.

Any process or method description in the flowcharts or otherwise described herein may be understood to represent a module, segment or portion of a code comprising one or more executable instructions for implementing a custom logic function or steps of a process. Moreover, the scope of the preferred embodiments of the present disclosure includes additional implementations in which the functions involved may be performed in an order rather than the order shown or discussed, including performing the functions in a substantially simultaneous manner or in a reverse order, which should be understood by those skilled in the art to which the embodiments of the present disclosure pertain.

The logic and/or steps represented in the flowchart or otherwise described herein may be, for example, considered as an ordered listing of executable instructions for implementing logical functions, and may be embodied in any computer-readable medium for use by or in combination with an instruction execution system, apparatus, or device, such as a computer-based system, processor-containing system, or other system that can fetch the instructions from the instruction execution system, apparatus, or device. For this specification, a "computer-readable medium" may be any apparatus that can contain, store, communicate, propagate, or transport a program for use by or in combination with an instruction execution system, apparatus, or device. More specific examples (non-exhaustive list) of the computer-readable medium include: an electrical connection (an electronic device) having one or more wires, a portable computer diskette (a magnetic device), a random access memory (RAM), a Read-only memory (ROM), an erasable programmable read only memory (EPROM or flash memory), an optical fiber device, and a portable compact disk read only memory (CDROM). In addition, the computer-readable medium may even be paper or another suitable medium on which the program can be printed, as the program can be electronically captured via, for instance, optical scanning of the paper or other medium, then compiled, interpreted or otherwise processed in a suitable manner, if necessary, and then stored in a computer memory.

It should be understood that the various portions of the present disclosure may be implemented in hardware, software, firmware or any combination thereof. In the above embodiments, a plurality of steps or methods may be implemented by software or firmware executed by appropriate instructions stored in a memory. For example, if it is realized by hardware, it may be realized by any one of the following technologies known in the art or a combination thereof as in another embodiment: a discrete logic circuit having logic gates for implementing logic functions upon data signals, an application specific integrated circuit having appropriate combinational logic gates, a programmable gate array (PGA), a field programmable gate array (FPGA), etc.

One having ordinary skills in the art can understand that all or part of the steps included in the method of implementing the above embodiments can be completed by means of relevant hardware that is instructed by a program, and the program can be stored in a computer-readable storage medium, and comprises any one or combination of the steps in the method embodiment when being executed.

In addition, various functional units in various embodiments of the present disclosure may be integrated into one processing module, or may exist physically separately, or two or more of the units may be integrated into one module. The above integrated modules can be implemented in the form of hardware or in the form of software functional modules. The integrated modules, if implemented in the form of software functional modules and sold or used as separate products, may also be stored in a computer-readable storage medium.

The storage medium mentioned above may be a read only memory, a magnetic disk, an optical disk or the like. While the embodiments of the present disclosure have been shown and described above, it is understood that the above-described embodiments are illustrative and are not to be construed as limiting the present disclosure, and a person having ordinary skills in the art can make changes, modifications, substitutions and variations to the above embodiments.

What is claimed is:

1. A shift register unit comprising:
an input circuit connected to a first voltage terminal, an input signal terminal, a reset signal terminal, a third voltage terminal and a first node, and configured to control a potential of the first node based on a first voltage signal received by the first voltage terminal, an input signal received by the input signal terminal and a reset signal received by the reset signal terminal;
a pull-up circuit connected to the first node, a clock signal terminal and a signal output terminal of the shift register unit, and configured to control an output of the signal output terminal;
a control circuit connected to a second voltage terminal, the first node and a second node, and configured to control a potential of the second node based on a second voltage signal received by the second voltage terminal and the potential of the first node; and
a first discharge circuit connected to the second node, the third voltage terminal, the first node and the signal output terminal, and configured to control, after being turned on under the control of the potential of the second node, the first node and the signal output terminal by using the third voltage terminal, and discharging a pixel unit, the first node and the signal output terminal, the pixel unit being connected to the signal output terminal,
wherein the shift register unit further comprises: a second discharge circuit connected to a discharge control terminal, the third voltage terminal and the second node, and configured to discharge the second node by using the third voltage terminal under the control of a discharge control signal received by the discharge control terminal,
wherein the second discharge circuit comprises a fourth transistor having a gate electrode connected to the discharge control terminal, a first electrode connected to the second node, and a second electrode connected to the third voltage terminal,
wherein the second discharge circuit being configured to discharge the second node by using the third voltage terminal under the control of the discharge control signal received by the discharge control terminal comprises:
the second discharge circuit being configured to discharge the second node based on a second level provided by the third voltage terminal under the control of the discharge control signal received by the discharge control terminal, wherein the second level is powered down to the ground at a second speed, the second speed is substantially less than a first speed.

2. The shift register unit according to claim 1, wherein the control circuit comprises:
a first transistor having a gate electrode and a first electrode which are both connected to the second voltage terminal, and a second electrode connected to the second node; and
an eighth transistor having a gate electrode connected to the first node, a first electrode connected to the second node, and a second electrode connected to the third voltage terminal.

3. The shift register unit according to claim 2, wherein the first discharge circuit is further connected to a fourth voltage terminal, and comprises:
a second transistor having a gate electrode connected to the second node, a first electrode connected to the signal output terminal, and a second electrode connected to the third voltage terminal;
a third transistor having a gate electrode connected to the second node, a first electrode connected to the first node, and a second electrode connected to the third voltage terminal; and
a fifth transistor having a gate electrode connected to the fourth voltage terminal, a first electrode connected to the signal output terminal, and a second electrode connected to the third voltage terminal.

4. The shift register unit according to claim 1, wherein the pull-up circuit comprises:
- a ninth transistor having a gate electrode connected to the input circuit, a first electrode connected to the clock signal terminal, and a second electrode connected to the signal output terminal; and
- a first capacitor having one end connected to the first node and the other end connected to the signal output terminal.

5. The shift register unit according to claim 1, wherein the input circuit comprises:
- a sixth transistor having a gate electrode connected to the input signal terminal, a first electrode connected to the first voltage terminal, and a second electrode connected to the first node; and
- a seventh transistor having a gate electrode connected to the reset signal terminal, a first electrode connected to the first node, and a second electrode connected to the third voltage terminal.

6. The shift register unit according to claim 5, wherein the first to the ninth transistors are all thin film transistors (TFTs).

7. The shift register unit according to claim 6, wherein the first to the ninth transistors are all N-type thin film transistors.

8. The shift register unit according to claim 1, wherein the first discharge circuit being configured to control, after being turned on under the control of the potential of the second node, the first node and the signal output terminal by using the third voltage terminal, and discharging the pixel unit, the first node and the signal output terminal, the pixel unit being connected to the signal output terminal comprises:
- the first discharge circuit being configured to control, after being turned on under the control of the potential of the second node, the first node and the signal output terminal by using the third voltage terminal, and turning on and discharging the pixel unit connected to the signal output terminal, and then control the first node and the signal output terminal to be discharged based on a second level provided by the third voltage terminal that is powered down to the ground at the first speed.

9. The shift register unit according to claim 5, wherein a turn-on voltage drop of a third transistor is much greater than a turn-on voltage drop of the sixth transistor.

10. The shift register unit according to claim 2, wherein a turn-on voltage drop of the eighth transistor is much less than a turn-on voltage drop of the first transistor.

11. A gate driving circuit comprising a plurality of stages of the shift register units according to claim 1, wherein
- except for the shift register unit at a first stage, the input signal terminal of the shift register unit at each of the remaining stages is connected to the signal output terminal of the shift register unit at an immediately preceding stage; and
- except for the shift register unit at the last stage, the signal output terminal of the shift register unit at each of the remaining stages is connected to the reset signal terminal of the shift register unit at an immediately preceding stage.

12. A display device comprising the gate driving circuit according to claim 11.

13. The display device according to claim 12, further comprising a power-down circuit, a timing control chip and a power management circuit, wherein the power-down circuit is connected to each of the timing control chip and the power management circuit,
- wherein the power-down circuit is configured to detect a voltage of a power supply of the display device and send a shutdown signal to the timing control chip and the power management circuit when the voltage of the power supply is lower than a preset voltage threshold; and
- wherein the timing control chip and the power management circuit control the shift register unit to enter a shutdown process according to the shutdown signal.

14. The display device according to claim 12, wherein the display device is an oxide thin film transistor (TFT) display device.

15. A method for driving a shift register unit according to claim 1, comprising:
- controlling, by the control circuit, a potential of the second node under the control of a second voltage signal received by the second voltage terminal, so that the first discharge circuit is turned on under the control of the potential of the second node, and controls an output of the signal output terminal according to a first level provided by the third voltage terminal, and turning on and discharging a corresponding pixel unit, during a shutdown process; and
- controlling, by the first discharge circuit, the first node and the signal output terminal to be discharged based on the second level provided by the third voltage terminal that is powered down to the ground at the first speed.

16. The method according to claim 15, further comprising:
- discharging the second node by the second discharge circuit based on the second level provided by the third voltage terminal that is powered down to the ground at the second speed, under the control of a discharge control signal received by a discharge control terminal;
- wherein the second speed is substantially less than the first speed.

17. The method according to claim 15, further comprising:
- controlling, by the control circuit, the potential of the second node under the control of the second voltage signal received by the second voltage terminal, so that the first discharge circuit is turned on under the control of the potential of the second node, and pulls down the first node and the signal output terminal based on the second level provided by the third voltage terminal, during a turn-on process;
- pulling up, by the input circuit, the first node to a first level based on an input signal of the input signal terminal and using a first voltage signal of the first voltage terminal, so that the pull-up circuit is turned on and the control circuit controls the first discharge circuit to be turned off;
- pulling up, by the pull-up circuit, the signal output terminal to a first level based on a clock signal of the clock signal terminal, so that a corresponding pixel unit is turned on; and
- pulling down, by the input circuit, the first node to the second level based on a reset signal of the reset signal terminal, so that the control circuit controls the signal output terminal to be reset by the first discharge circuit.

* * * * *